US010121752B2

(12) United States Patent
Pietambaram et al.

(10) Patent No.: US 10,121,752 B2
(45) Date of Patent: Nov. 6, 2018

(54) SURFACE FINISHES FOR INTERCONNECTION PADS IN MICROELECTRONIC STRUCTURES

(71) Applicant: INTEL CORPORATION, Santa Clara, CA (US)

(72) Inventors: Srinivas V. Pietambaram, Gilbert, AZ (US); Kyu Oh Lee, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/545,670

(22) PCT Filed: Feb. 25, 2015

(86) PCT No.: PCT/US2015/017435
§ 371 (c)(1),
(2) Date: Jul. 21, 2017

(87) PCT Pub. No.: WO2016/137452
PCT Pub. Date: Sep. 1, 2016

(65) Prior Publication Data
US 2018/0019219 A1 Jan. 18, 2018

(51) Int. Cl.
*H01L 23/00* (2006.01)
*B23K 35/26* (2006.01)
(Continued)

(52) U.S. Cl.
CPC ............ *H01L 24/05* (2013.01); *B23K 35/262* (2013.01); *C22C 13/00* (2013.01); *C22C 19/03* (2013.01);
(Continued)

(58) Field of Classification Search
CPC ... H01L 24/05; B23K 35/262; B23K 35/3033; B23K 35/3053; B23K 35/3093; B23K 35/36; C22C 13/00
See application file for complete search history.

(56) References Cited

U.S. PATENT DOCUMENTS

2001/0019882 A1 9/2001 Jiang
2002/0185716 A1 12/2002 Abys et al.
(Continued)

FOREIGN PATENT DOCUMENTS

TW 201241918 10/2012
TW 201442184 11/2014

OTHER PUBLICATIONS

International Search Report and Written Opinion for International Patent Application No. PCT/US2015/017435, dated Nov. 25, 2015.
(Continued)

*Primary Examiner* — Marc Armand
*Assistant Examiner* — Sarah Salerno
(74) *Attorney, Agent, or Firm* — Green, Howard, & Mughal LLP.

(57) ABSTRACT

A surface finish may be formed in a microelectronic structure, wherein the surface finish may include a multilayer interlayer structure. Thus, needed characteristics, such as compliance and electro-migration resistance, of the interlayer structure may be satisfied by different material layers, rather attempting to achieve these characteristics with a single layer. In one embodiment, the multilayer interlayer structure may comprises a two-layer structure, wherein a first layer is formed proximate a solder interconnect and comprises a material which forms a ductile joint with the solder interconnect, and a second layer comprising a material having strong electro-migration resistance formed between the first layer and an interconnection pad. In a further embodiment, third layer may be formed adjacent the
(Continued)

interconnection pad comprising a material which forms a ductile joint with the interconnection pad.

18 Claims, 4 Drawing Sheets

(51) Int. Cl.
*C22C 13/00* (2006.01)
*C22C 19/03* (2006.01)
*H01L 23/498* (2006.01)

(52) U.S. Cl.
CPC .. *H01L 23/49838* (2013.01); *H01L 23/49866* (2013.01); *H01L 24/03* (2013.01); *H01L 24/13* (2013.01); *H01L 24/16* (2013.01); *H01L 23/49811* (2013.01); *H01L 24/81* (2013.01); *H01L 2224/0401* (2013.01); *H01L 2224/0558* (2013.01); *H01L 2224/0566* (2013.01); *H01L 2224/0568* (2013.01); *H01L 2224/05147* (2013.01); *H01L 2224/05564* (2013.01); *H01L 2224/05644* (2013.01); *H01L 2224/05655* (2013.01); *H01L 2224/05657* (2013.01); *H01L 2224/05664* (2013.01); *H01L 2224/05683* (2013.01); *H01L 2224/05684* (2013.01); *H01L 2224/13026* (2013.01); *H01L 2224/13111* (2013.01); *H01L 2224/13113* (2013.01); *H01L 2224/13116* (2013.01); *H01L 2224/13139* (2013.01); *H01L 2224/13147* (2013.01); *H01L 2224/16227* (2013.01); *H01L 2224/16238* (2013.01); *H01L 2224/81444* (2013.01); *H01L 2924/014* (2013.01); *H01L 2924/01015* (2013.01); *H01L 2924/15311* (2013.01)

(56) References Cited

U.S. PATENT DOCUMENTS

2010/0973281 12/2010 Alkolkar et al.
2012/0044652 A1 2/2012 Horikawa et al.
2014/0126955 A1 5/2014 Ho et al.
2014/0183738 A1 7/2014 Jezewski et al.

OTHER PUBLICATIONS

Hasseb, et al., “Interfacial reactions between Sn-3.5 Ag solder and Ni—W alloy films”, Journal of Materials Science: Materials in Electronics, vol. 22, Iss. 9, Feb. 13, 2011, pp. 1372-1377.

Office Action for Taiwan Patent Application No. 105100566 dated Dec. 4, 2017.

Search Report for Taiwan Patent Application No. 105100566, dated Dec. 29, 2016.

SURFACE FINISHES FOR INTERCONNECTION PADS IN MICROELECTRONIC STRUCTURES

RELATED APPLICATION

The present application is a national stage entry of PCT Patent Application No. PCT/US2015/017435, filed on Feb. 25, 2015, entitled "SURFACE FINISHES FOR INTERCONNECTION PADS IN MICROELECTRONIC STRUCTURES", which is hereby incorporated herein by reference in its entirety and for all purposes.

TECHNICAL FIELD

Embodiments of the present description generally relate to the field of microelectronic device fabrication, and, more particularly, to surface finishes formed on interconnection pads for the electrical attachment of microelectronic components with solder interconnects.

BACKGROUND

Microelectronic devices are generally fabricated from various microelectronic components, including, but not limited to, at least one microelectronic die (such as a microprocessor, a chipset, a graphics device, a wireless device, a memory device, an application specific integrated circuit, or the like), at least one passive component (such as resistors, capacitors, inductors and the like), and at least one microelectronic substrate (such as interposers, motherboards, and the like) for mounting the components. The various microelectronic components may be electrically interconnected to one another through solder interconnects extending between interconnection pads on one microelectronic component to interconnection pads on another microelectronic component.

The microelectronic industry is continually striving to produce ever faster and smaller microelectronic devices for use in various electronic products, including, but not limited to portable products, such as portable computers, digital cameras, electronic tablets, cellular phones, and the like. As the size of the microelectronic components, such as microelectronic devices and microelectronic substrates, are reduced, the current densities of the microelectronic components increases, as will be understood to those skilled in the art. As these current densities increase, surface finishes, which are disposed between interconnection pads and the solder interconnects, must not only form a ductile interconnection or "joint" between interconnection pads and the solder interconnects, but also have sufficiently strong electro-migration resistance to meet maximum current ($I_{max}$) demands of the smaller microelectronic components. Therefore, there is a need to develop surface finishes and methods of fabrication thereof that can provide a desired maximum current ($I_{max}$) while maintaining a ductile joint between interconnection pads and the solder interconnects.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The present disclosure will be described with additional specificity and detail through use of the accompanying drawings, such that the advantages of the present disclosure can be more readily ascertained, in which:

DESCRIPTION OF EMBODIMENTS

Figure 1:
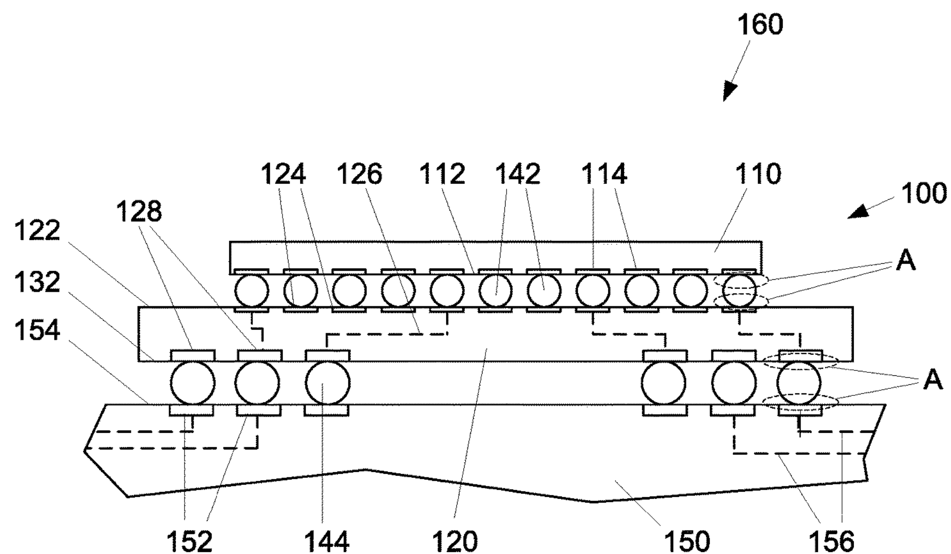
FIG. 1 is a side cross sectional view of a microelectronic structure, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

In the production of microelectronic structures, microelectronic packages are generally mounted on microelectronic board/substrate that provides electrical communication routes between the microelectronic packages and external components. As shown in FIG. 1, a microelectronic package 100 may comprise a microelectronic device 110, such as a microprocessor, a chipset, a graphics device, a wireless device, a memory device, an application specific integrated circuit, or the like, attached to a first surface 122 of a microelectronic interposer/substrate 120 through a plurality of solder interconnects 142 in a configuration generally known as a flip-chip or controlled collapse chip connection ("C4") configuration. The device-to-interposer/substrate solder interconnects 142 may extend from interconnection pads 114 on an active surface 112 of the microelectronic device 110 and interconnection pads 124 on the microelectronic interposer/substrate first surface 122. The microelectronic device interconnection pads 114 may be in electrical communication with integrated circuitry (not shown) within the microelectronic device 110. The microelectronic interposer/substrate 120 may include at least one conductive route 126 extending therethrough from at least one microelectronic interposer/substrate interconnection pad 124 and at least one microelectronic package interconnection pad 128 on or proximate a second surface 132 of the microelectronic interposer/substrate 120. The microelectronic interposer/substrate 120 may reroute a fine pitch (center-to-center distance between the microelectronic device interconnection pads 114) of the microelectronic device interconnection pads 114 to a relatively wider pitch of the microelectronic package interconnection pads 128.

The microelectronic package 100 may be attached to a microelectronic board/substrate 150, such as printed circuit board, a motherboard, and the like, through a plurality of solder interconnects 144, to form a microelectronic structure 160. The package-to-board/substrate solder interconnects 144 may extend between the microelectronic package interconnection pads 128 and substantially mirror-image interconnection pads 152 on an attachment surface 154 of the microelectronic board/substrate 150. The microelectronic board/substrate interconnection pads 152 may be in electrical communication with conductive routes (shown as dashed lines 156) within the microelectronic board/substrate 150. The microelectronic board/substrate conductive routes 156 may provide electrical communication routes to external components (not shown).

Both the microelectronic interposer/substrate 120 and the microelectronic board/substrate 150 may be primarily composed of any appropriate material, including, but not limited to, bismaleimide triazine resin, fire retardant grade 4 material, polyimide materials, glass reinforced epoxy matrix material, and the like, as well as laminates or multiple layers thereof. The microelectronic interposer/substrate conductive routes 126 and the microelectronic board/substrate conductive routes 156 may be composed of any conductive material, including but not limited to metals, such as copper and aluminum, and alloys thereof. As will be understood to those skilled in the art, microelectronic interposer/substrate conductive routes 126 and the microelectronic board/substrate conductive routes 156 may be formed as a plurality of conductive traces (not shown) formed on layers of dielectric material (not shown), which are connected by conductive vias (not shown).

The device-to-interposer/substrate solder interconnects 142 and the package-to-board/substrate solder interconnects 144 can be made of any appropriate solder material, including, but not limited to, lead/tin alloys, such as 63% tin/37% lead solder, and high tin content alloys (e.g. 90% or more tin), such as tin/bismuth, eutectic tin/silver, ternary tin/silver/copper, eutectic tin/copper, and similar alloys. The solder may be reflowed, either by heat, pressure, and/or sonic energy to secure the solder between the respective interconnections pads, as will be understood to those skilled in the art.

Figure 2:
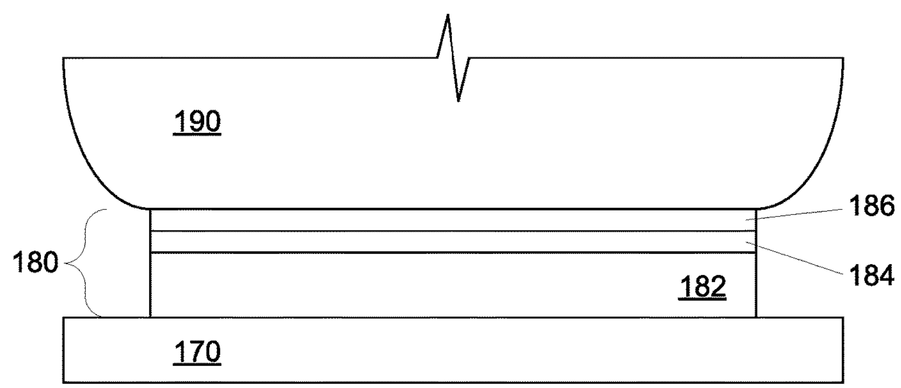
FIG. 2 is a side cross sectional view of an interconnection pad and a solder interconnect with a surface finish structure disposed therebetween, as known in the art.

As shown in FIG. 2 (a close-up of any of the areas labeled A in FIG. 1), an interconnection pad 170 may represent any of the microelectronic device interconnection pads 114, the microelectronic interposer/substrate interconnection pads 124, the microelectronic package interconnection pads 128, and the microelectronic board/substrate interconnection pads 152 of FIG. 1, and a solder interconnect 190 may represent any of the device-to-interposer/substrate solder interconnects 142 and the package-to-board/substrate solder interconnects 144 of FIG. 1. As illustrated, a surface finish structure 180 may be disposed between the interconnection pad 170 and the solder interconnect 190. As known in the art, the surface finish structure 180 may comprise a interlayer 182 (such as a nickel-containing metal) abutting the interconnection pad 170 (such as a copper-containing metal), a barrier layer 184 (such as palladium-containing material) on the interlayer 182, and an oxidation resistant and solder wetting layer 186 (such as a gold-containing metal) on the barrier layer 184. As is understood to those skilled in the art, the interlayer 182 is utilized to provide the characteristic of high conductivity for achieving a desired maximum current ($I_{max}$) and to provide the characteristic of ductility for providing sufficient flexibility to absorb any physical shocks to the microelectronic components, such that the joint formed therewith does not crack or break. For such a known surface finish structure 180, consumption of the interlayer 182 is a significant cause for a decreased maximum current ($I_{max}$). As is known in the art, consumption of the interlayer 182 occurs when at least one component of the interlayer 182, such as nickel, diffuses into the solder interconnect 190. Such consumption may be reduced by the barrier layer 184, wherein the barrier layer 184 may also reduce the diffusion of at least one component of the solder interconnect 190, such as tin, which may contaminate the interconnection pad 170. However, such a known surface finish structure 180 cannot meet future maximum current ($I_{max}$) requirements. Although maximum current ($I_{max}$) may be improved by increasing a thickness of the barrier layer 184, such an increase may increase brittleness thereof, which may cause the joint to break, and is, therefore, not a solution. Furthermore, increasing the thickness of the interlayer 182 is also not a solution, as increasing the thickness of the interlayer 182 may cause bridging between adjacent solder interconnects 190, as will be understood to those skilled in the art.

Embodiments of the present description include forming a multilayer interlayer structure, rather than a single layer interlayer structure. Thus, desired characteristics, such as ductility and electro-migration resistance, of the interlayer structure may be satisfied by different material layers, rather than attempting to achieve all of the desired characteristics with a single layer. In one embodiment, the multilayer interlayer structure comprises a two-layer structure, wherein a first layer is formed proximate a solder interconnect and comprises a material which forms a ductile connection or joint with the solder interconnect, and a second layer comprises a material having strong electro-migration resistance formed between the first layer and an interconnection pad. In another embodiment, the multilayer interlayer structure comprises a three layer structure, wherein a first layer is formed proximate a solder interconnect and comprises a material which forms a ductile connection or joint with the solder interconnect, a second layer comprises a material having strong electro-migration resistance, and a third layer adjacent the interconnection pad comprises a material which forms a ductile connection or joint with the interconnection pad, wherein the second layer is positioned between the first layer and the third layer. In further embodiments, multilayer interlayer structure may comprise more than three layers to provide better electro-migration resistance while maintaining a ductile connection or joint with the solder interconnect or/and the interconnection pad.

Figure 3:
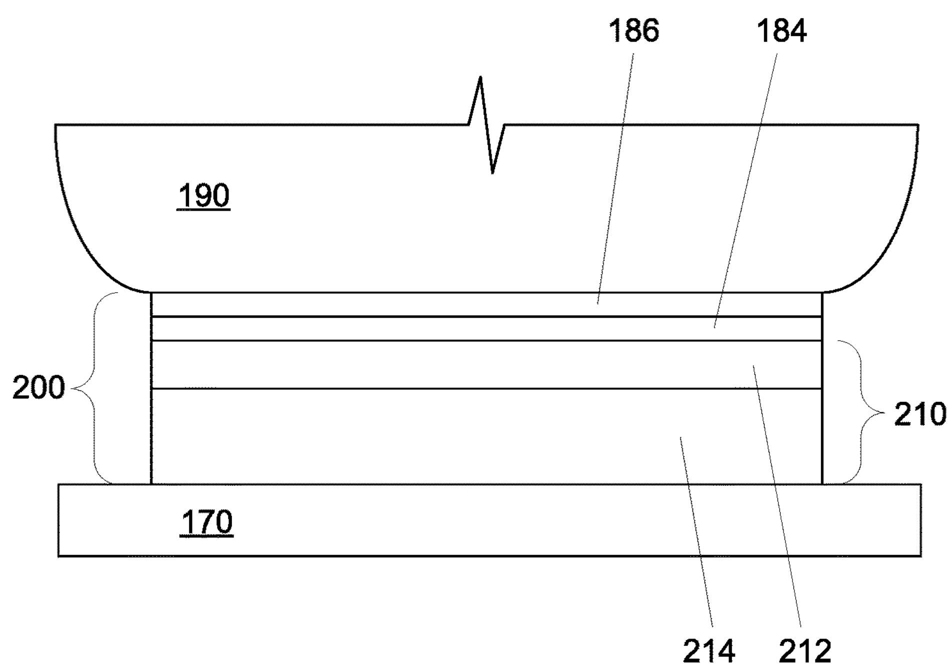
FIG. 3 is a side cross sectional view of an interconnection pad and a solder interconnect with a surface finish structure disposed therebetween, according to one embodiment of the present description.

As shown in FIG. 3 (a close-up of any of the areas labeled A in FIG. 1), a surface finish 200 may include a multilayer interlayer structure 210 comprising an electro-migration resistant layer 214 formed on the interconnection pad 170 and a solder interconnect ductile layer 212 formed on the electro-migration resistant layer 214. The surface finish 200 may further comprise the barrier layer 184 formed on the multilayer interlayer structure 200, and the oxidation resistant and solder wetting layer 186 formed on the barrier layer 184.

The interconnection pad 170 may be made from any appropriate conductive materials, such as metals. In one embodiment, the interconnection pad 170 comprises copper. The solder interconnect 190 may be made of any appropriate solder material, including, but not limited to, lead/tin alloys, such as 63% tin/37% lead solder, and high tin content alloys (e.g. 90% or more tin), such as tin/bismuth, eutectic tin/silver, ternary tin/silver/copper, eutectic tin/copper, and similar alloys.

The barrier layer 184 may be any material which resists diffusion of at least one component of the solder interconnect ductile layer 212 into the solder interconnect 190 and resists diffusion of at least one component of the solder interconnect 190, such as tin, toward the interconnection pad 170. In one embodiment, the barrier layer 184 may comprise a palladium-containing material. In a specific embodiment, the barrier layer 184 comprises palladium and phosphorus. The oxidation resistant layer 186 may be any appropriate conductive material that will reduce oxidation of the barrier layer 184 and/or the multilayer interlayer structure 210. In one embodiment, the oxidation resistant layer 186 comprises gold.

The solder interconnect ductile layer 212 may be any appropriate material, including but not limited, to a low to medium phosphorus content nickel material. For the purposes of the present description, a low to medium phosphorus content nickel material may be defined to be a nickel material having a phosphorus content of between about 2% and 10% by weight.

The electro-migration resistant layer 214 may be any appropriate material that diffuses little or no material therefrom. In one embodiment, the electro-migration resistant layer 214 may include an amorphous or nano-crystalline film, having little or no grain boundaries, exhibiting desirable electrical conductivity. For the purpose of the present description, the amorphous or nano-crystalline film may include, but not limited to, a high phosphorus content nickel material wherein the phosphorus content of between about 11% and 20% by weight. In another embodiment, the electro-migration resistant layer 214 may include a high atomic weight metal exhibiting desired electrical conductivity. For the purposes of the present description, a high atomic weight metal may be defined to be a metal or metal alloy formed from the transition metal group in the atomic table. In one embodiment, the high atomic weight metal may include nickel, cobalt, and/or iron. In a further embodiment, the electro-migration resistant layer 214 may include any refractory metal or its alloy with nickel, cobalt, and/or iron. In one embodiment, the refractory metal may include tungsten, molybdenum, and/or rhenium. In a further embodiment, the electro-migration resistant layer 214 may comprise an alloy of transitional metal, refractory metal, and/or an additional element that may include, but not limited to, phosphorus, exhibiting desirable electrical conductivity. In one embodiment, the transition metal may include nickel, iron, or cobalt, the refractory metal may include tungsten, molybdenum, or rhenium, and the additional element may be phosphorus.

Figure 4:
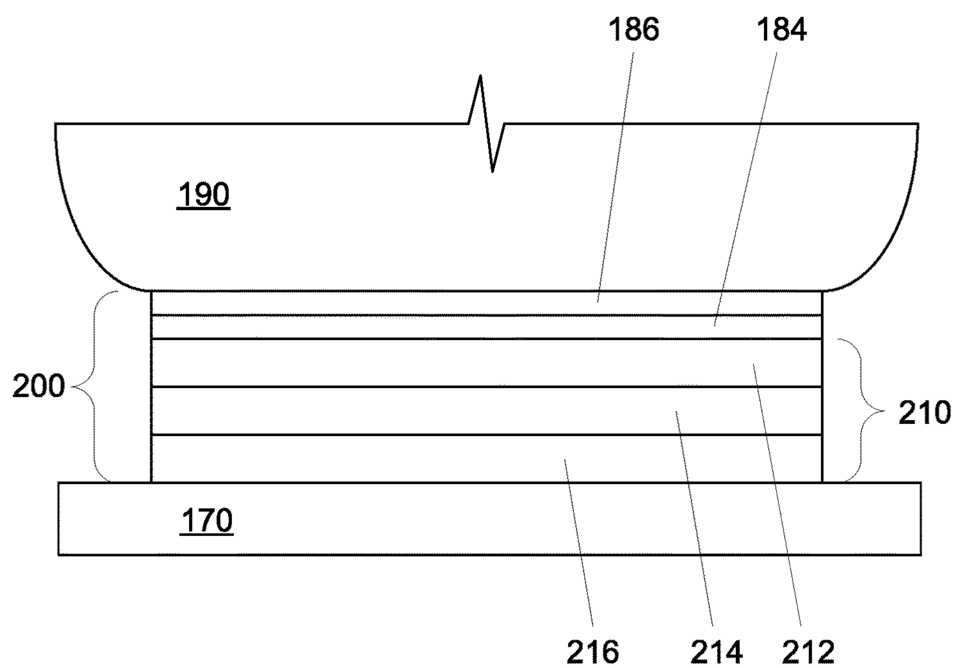
FIG. 4 is a side cross sectional view of an interconnection pad and a solder interconnect with a surface finish structure disposed therebetween, according to another embodiment of the present description.

As shown in FIG. 4 (a close-up of any of the areas labeled A in FIG. 1), the surface finish 200 may include the multilayer interlayer structure 210 comprising an interconnection pad ductile layer 216 formed on the interconnection pad 170, the electro-migration resistant layer 214 formed on the interconnection pad ductile layer 216, and a solder interconnect ductile layer 212 formed on the electro-migration resistant layer 214. The interconnection pad ductile layer 216 may be any appropriate material, including but not limited, to a low to medium phosphorus content nickel material. The surface finish 200 may further comprise the barrier layer 184 formed on the multilayer interlayer structure 200, and the oxidation resistant layer 186 formed on the barrier layer 184.

Figure 5:
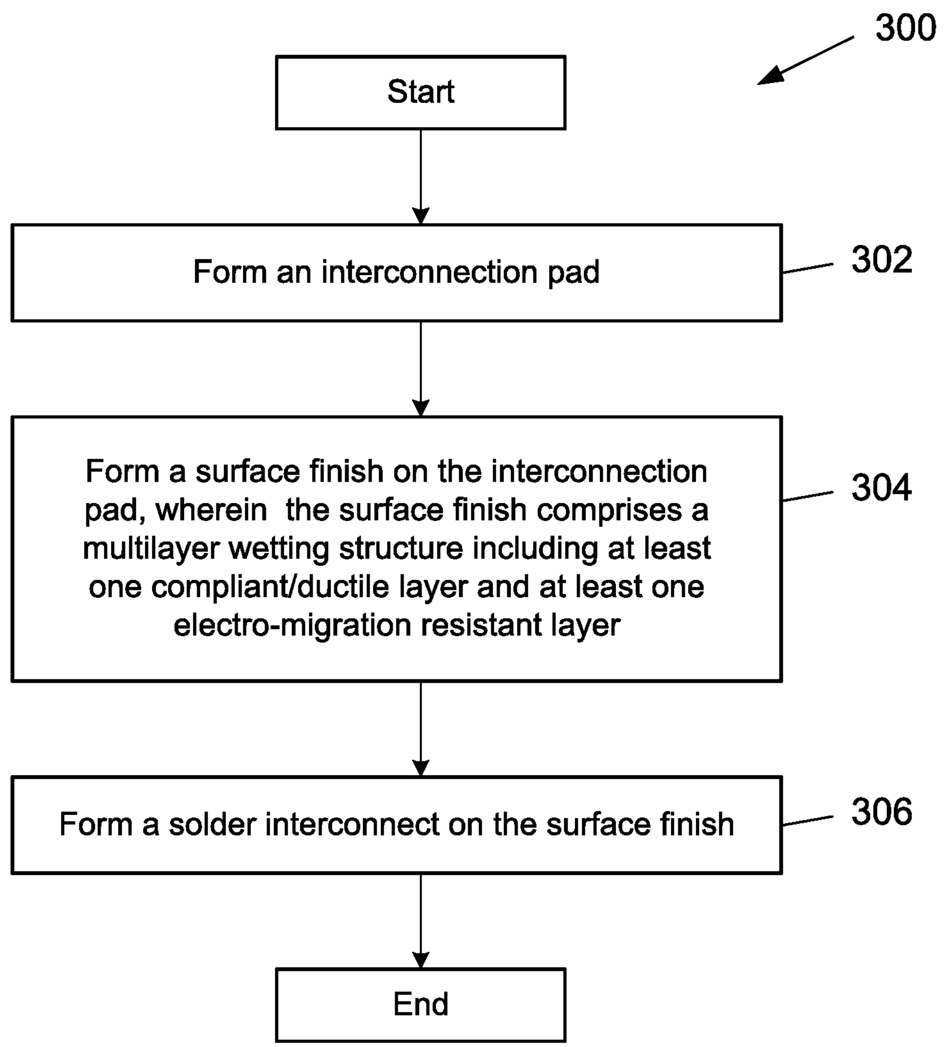
FIG. 5 is a flow chart of a process of fabricating a microelectronic package, according to an embodiment of the present description.

FIG. 5 is a flow chart of a process 300 of fabricating a microelectronic structure according to an embodiment of the present description. As set forth in block 302, an interconnection pad may be formed. A surface finish may be formed on the interconnection pad, wherein the surface finish comprises a multilayer interlayer structure including at least one ductile layer and at least one electro-migration resistant layer, as set forth in block 304. As set forth in block 306, a solder interconnect may be formed on the surface finish.

Figure 6:
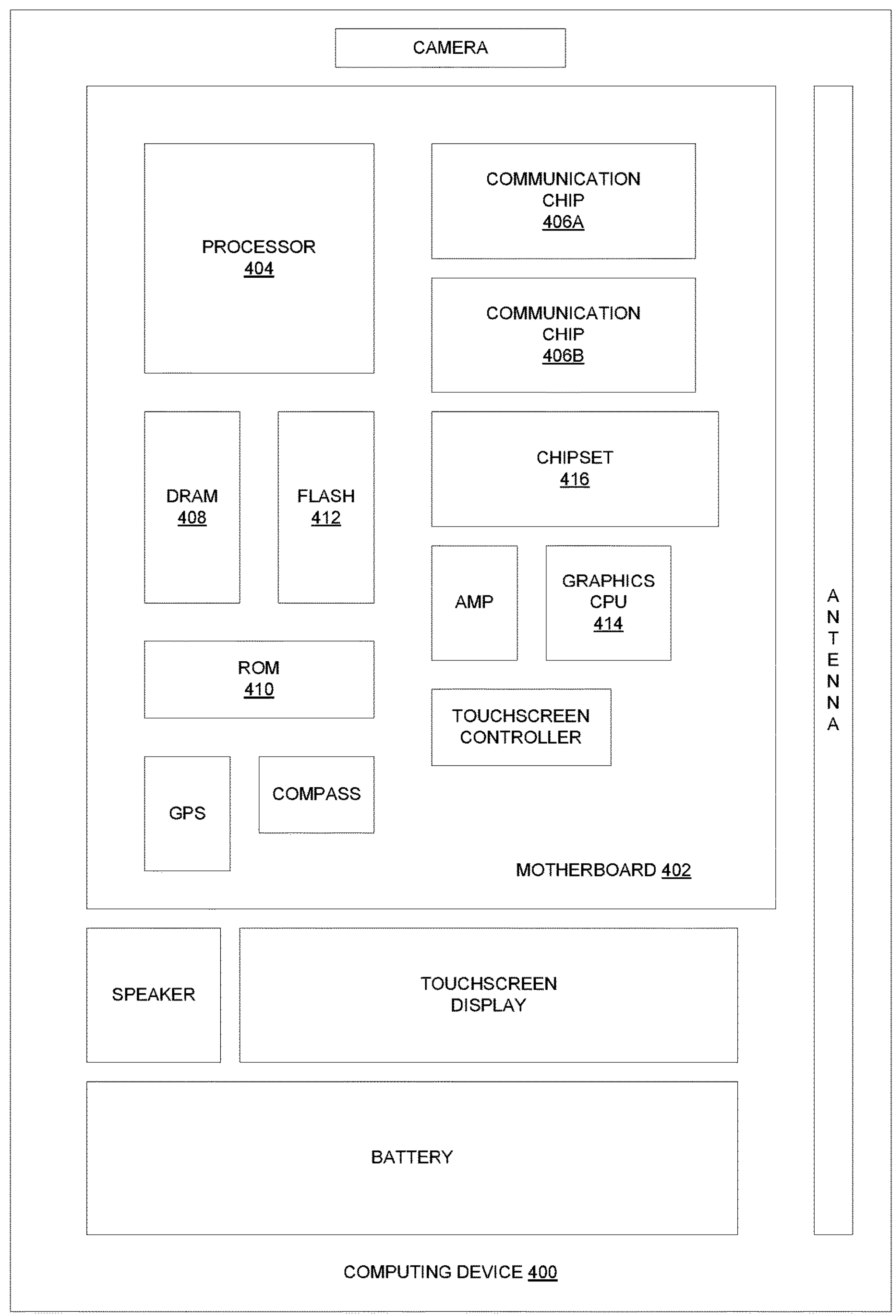
FIG. 6 illustrates a computing device in accordance with one implementation of the present description.

FIG. 6 illustrates a computing device 400 in accordance with one implementation of the present description. The computing device 400 houses a board 402. The board may include a number of microelectronic components, including but not limited to a processor 404, at least one communication chip 406A, 406B, volatile memory 408, (e.g., DRAM), non-volatile memory 410 (e.g., ROM), flash memory 412, a graphics processor or CPU 414, a digital signal processor (not shown), a crypto processor (not shown), a chipset 416, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker (not shown), a camera, and a mass storage device (not shown) (such as hard disk drive, compact disk (CD), digital versatile disk (DVD), and so forth). Any of the microelectronic components may be physically and electrically coupled to the board 402. In some implementations, at least one of the microelectronic components may be a part of the processor 404.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

Any of the microelectronic components within the computing device 400 may include a surface finish on a interconnection pad, wherein the surface finish includes a multilayer interlayer structure, as described above.

In various implementations, the computing device may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-6. The subject matter may be applied to other microelectronic device and assembly applications, as will be understood to those skilled in the art.

The following examples pertain to further embodiments, wherein Example 1 is a microelectronic structure, comprising an interconnection pad; a surface finish on the interconnection pad, wherein the surface finish comprises a multilayer interlayer structure including at least one ductile layer and at least one electro-migration resistant layer; and a solder interconnect on the surface finish.

In Example 2, the subject matter of Example 1 can optionally include the at least one ductile layer comprising a nickel material having phosphorus content of between about 2% and 10% by weight.

In Example 3, the subject matter of either Example 1 or 2 can optionally include the at least one electro-migration resistant layer comprising a nickel material having phosphorus content of between about 11% and 20% by weight.

In Example 4, the subject matter of either Example 1 or 2 can optionally include the at least one electro-migration resistant layer comprising a high molecular weight metal.

In Example 5, the subject matter of Example 4 can optionally include the high molecular weight metal being selected from the group consisting of nickel, cobalt, and iron.

In Example 6, the subject matter of either Example 1 or 2 can optionally include the electro-migration resistant layer comprising a metal selected from the group consisting of nickel, cobalt, and iron in combination with a refractory metal.

In Example 7, the subject matter of Example 6 can optionally include the electro-migration resistant layer further comprising phosphorus, and wherein the refractory metal is selected from the group consisting of tungsten, molybdenum, and rhenium.

In Example 8, the subject matter of either Example 1 or 2 can optionally include the at least one electro-migration resistant layer comprising an amorphous layer.

In Example 9, the subject matter of either Example 1 or 2 can optionally include the surface finish comprising a first electro-migration resistant layer on the interconnection pad and a ductile layer on the electro-migration resistant layer.

In Example 10, the subject matter of Example 1 can optionally include the surface finish comprising a first ductile layer on the interconnection pad, an electro-migration resistant layer on the first ductile layer, and a second ductile layer on the electro-migration resistant layer.

The following examples pertain to further embodiments, wherein Example 11 is a method of fabricating a microelectronic structure, comprising: forming an interconnection pad; forming a surface finish on the interconnection pad, wherein the surface finish comprises a multilayer interlayer structure including at least one ductile layer and at least one electro-migration resistant layer; and forming a solder interconnect on the surface finish.

In Example 12, the subject matter of Example 11 can optionally include forming the surface finish comprising forming the at least one ductile layer comprising a nickel material having phosphorus content of between about 2% and 10% by weight.

In Example 13, the subject matter of either Example 11 or 12 can optionally include forming the at least one electro-migration resistant layer comprising forming a nickel material layer having phosphorus content of between about 11% and 20% by weight.

In Example 14, the subject matter of either Example 11 or 12 can optionally include forming the surface finish comprising forming the at least one electro-migration resistant layer comprising a high molecular weight metal.

In Example 15, the subject matter of Example 14 can optionally include the forming the surface finish comprising forming the high molecular weight metal selected from the group consisting of nickel, cobalt, and iron.

In Example 16, the subject matter of either Example 11 or 12 can optionally include forming the surface finish comprising forming the electro-migration resistant layer selected from the group consisting of nickel, cobalt, and iron in combination with a refractory metal.

In Example 17, the subject matter of Example 16 can optionally include the electro-migration resistant layer further comprising phosphorus, and wherein the refractory metal comprises metal selected from the group consisting of tungsten, molybdenum, and rhenium.

In Example 18, the subject matter of either Example 11 or 12 can optionally include forming the at least one electro-migration resistant layer comprising forming an amorphous layer.

In Example 19, the subject matter of either Example 11 or 12 can optionally include forming the surface finish comprising forming a first electro-migration resistant layer on the interconnection pad and forming a ductile layer on the electro-migration resistant layer.

In Example 20, the subject matter of Example 11 can optionally include the forming the surface finish comprising forming a first ductile layer on the interconnection pad, forming an electro-migration resistant layer on the first ductile layer, and forming a second ductile layer on the electro-migration resistant layer.

The following examples pertain to further embodiments, wherein Example 21 is an electronic system, comprising a board; and a microelectronic structure attached to the board, wherein at least one of the microelectronic structure and the board includes an interconnection pad; a surface finish on the interconnection pad, wherein the surface finish comprises a multilayer interlayer structure including at least one ductile layer and at least one electro-migration resistant layer; and a solder interconnect on the surface finish.

In Example 22, the subject matter of Example 21 can optionally include the at least one ductile layer comprising a nickel material having phosphorus content of between about 2% and 10% by weight.

In Example 23, the subject matter of either Example 21 or 22 can optionally include the at least one electro-migration resistant layer comprising a nickel material layer having phosphorus content of between about 11% and 20% by weight.

In Example 24, the subject matter of either Example 21 or 22 can optionally include the at least one electro-migration resistant layer comprising a high molecular weight metal.

In Example 25, the subject matter of Example 24 can optionally include the high molecular weight metal being selected from the group consisting of nickel, cobalt, and iron.

In Example 26, the subject matter of either Example 21 or 22 can optionally include the electro-migration resistant layer comprising a metal selected from the group consisting of nickel, cobalt, and iron in combination with a refractory metal.

In Example 27, the subject matter of either Example 21 or 22 can optionally include the electro-migration resistant layer further comprising phosphorus, and wherein the refractory metal is selected from the group consisting of tungsten, molybdenum, and rhenium.

In Example 28, the subject matter of either Example 21 or 22 can optionally include the at least one electro-migration resistant layer comprising an amorphous layer.

In Example 29, the subject matter of either Example 21 or 22 can optionally include the surface finish comprising a first electro-migration resistant layer on the interconnection pad and a ductile layer on the electro-migration resistant layer.

In Example 30, the subject matter of Example 21 can optionally include the surface finish comprising a first ductile layer on the interconnection pad, an electro-migration resistant layer on the first ductile layer, and a second ductile layer on the electro-migration resistant layer.

Having thus described in detail embodiments of the present description, it is understood that the present description defined by the appended claims is not to be limited by particular details set forth in the above description, as many apparent variations thereof are possible without departing from the spirit or scope thereof.

What is claimed is:

1. A microelectronic structure, comprising:

an interconnection pad;

a surface finish on the interconnection pad, wherein the surface finish comprises a multilayer interlayer structure including a first ductile layer on the interconnection pad, at least one electro-migration resistant layer on the first ductile layer, and a second ductile layer on the at least one electro-migration resistant layer, wherein the first ductile layer and the second ductile layer each comprises a nickel-containing material having a phosphorus content of between about 2% and 10% by weight and wherein the at least one electro-migration resistant layer has a phosphous content of between about 11% and 20% by weight; and a solder interconnect on the surface finish.

2. The microelectronic structure of claim 1, wherein the at least one electro-migration resistant layer comprises a high atomic weight metal.

3. The microelectronic structure of claim 2, wherein the high atomic weight metal is selected from the group consisting of nickel, cobalt, and iron.

4. The microelectronic structure of claim 1, wherein the electro-migration resistant layer comprises a metal selected from the group consisting of nickel, cobalt, and iron in combination with a refractory metal.

5. The microelectronic structure of claim 4, wherein the electro-migration resistant layer further comprises phosphorus, and wherein the refractory metal is selected from the group consisting of tungsten, molybdenum, and rhenium.

6. The microelectronic structure of claim 1, wherein the at least one electro-migration resistant layer comprises an amorphous layer.

7. A method of fabricating a microelectronic structure, comprising:

forming an interconnection pad;

forming a surface finish on the interconnection pad, wherein the surface finish comprises a multilayer interlayer structure including a first ductile layer on the interconnection pad, at least one electro-migration resistant layer on the first ductile layer, and a second ductile layer on the at least one electro-migration resistant layer, wherein the first ductile layer and the second ductile layer each comprise a nickel-containing material having a phosphorus content of between about 2% and 10% by weight and wherein the at least one electromigration resistant layer has a phosphous content of between about 11% and 20% by weight; and forming a solder interconnect on the surface finish.

8. The method of claim 7, wherein forming the surface finish comprises forming the at least one electro-migration resistant layer comprising a high atomic weight metal.

9. The method of claim 8, wherein forming the surface finish comprises forming the high atomic weight metal selected from the group consisting of nickel, cobalt, and iron.

10. The method of claim 7, wherein forming the surface finish comprises forming the electro-migration resistant selected from the group consisting of nickel, cobalt, and iron in combination with a refractory metal.

11. The method of claim 10, wherein forming the electro-migration resistant layer further comprises phosphorus, and wherein forming the refractory metal comprises metal is selected from the group consisting of tungsten, molybdenum, and rhenium.

12. The method of claim 7, wherein forming the at least one electro-migration resistant layer comprises forming an amorphous layer.

13. An electronic system, comprising:

a board; and a microelectronic structure attached to the board, wherein at least one of the microelectronic structure and the board includes:

an interconnection pad;

a surface finish on the interconnection pad, wherein the surface finish comprises a multilayer interlayer structure including a first ductile layer on the interconnection pad, at least one electro-migration resistant layer on the first ductile layer, and a second ductile layer on the at least one electro-migration resistant layer, wherein the first ductile layer and the second ductile layer each comprise a nickel-containing material having a phosphorus content of between about 2% and 10% by weight and wherein the at least one electro-migration resistant layer has a phosphous content of between about 11% and 20% by weight; and a solder interconnect on the surface finish.

14. The electronic system of claim 13, wherein the at least one electro-migration resistant layer comprises a high atomic weight metal.

15. The electronic system of claim 14, wherein the high atomic weight metal is selected from the group consisting of nickel, cobalt, and iron.

16. The electronic system of claim 13, wherein the electro-migration resistant layer comprises a metal selected from the group consisting of nickel, cobalt, and iron in combination with a refractory metal.

17. The electronic system of claim 16, wherein the electro-migration resistant layer further comprises phosphorus, and wherein the refractory metal is selected from the group consisting of tungsten, molybdenum, and rhenium.

18. The electronic system of claim 13, wherein the at least one electro-migration resistant layer comprises an amorphous layer.

* * * * *